United States Patent [19]
Martin

[11] Patent Number: 5,610,431
[45] Date of Patent: Mar. 11, 1997

[54] COVERS FOR MICROMECHANICAL SENSORS AND OTHER SEMICONDUCTOR DEVICES

[75] Inventor: Jacob H. Martin, Wellesley, Mass.

[73] Assignee: The Charles Stark Draper Laboratory, Inc., Cambridge, Mass.

[21] Appl. No.: 440,528

[22] Filed: May 12, 1995

[51] Int. Cl.⁶ .................................................. H01L 29/82
[52] U.S. Cl. ........................ 257/415; 257/417; 257/418; 257/419; 257/704
[58] Field of Search .................................. 257/704, 417, 257/626, 418, 419, 415

[56] References Cited

U.S. PATENT DOCUMENTS

| | | | |
|---|---|---|---|
| 4,548,078 | 10/1985 | Bohrer et al. | 73/204 |
| 4,680,606 | 7/1987 | Knutti et al. | 357/26 |
| 4,744,249 | 5/1988 | Stewart | 73/505 |
| 4,744,863 | 5/1988 | Guckel et al. | 156/653 |
| 4,764,244 | 8/1988 | Chitty et al. | 156/630 |
| 4,853,669 | 8/1989 | Guckel et al. | 338/4 |
| 4,855,544 | 8/1989 | Glenn | 200/61.45 R |
| 4,861,420 | 8/1989 | Knutti et al. | 156/633 |
| 4,874,499 | 10/1989 | Smith et al. | 204/403 |
| 4,904,978 | 2/1990 | Barth et al. | 338/47 |
| 4,996,082 | 2/1991 | Guckel et al. | 427/99 |
| 4,996,627 | 2/1991 | Zias et al. | 361/283 |
| 5,013,396 | 5/1991 | Wise et al. | 156/628 |
| 5,075,253 | 12/1991 | Sliwa, Jr. | 437/209 |
| 5,101,669 | 4/1992 | Holm-Kennedy et al. | 73/862.64 |
| 5,165,289 | 11/1992 | Tilmans | 73/862.59 |
| 5,207,103 | 5/1993 | Wise et al. | 73/724 |
| 5,233,871 | 8/1993 | Schwarz et al. | 73/493 |
| 5,233,874 | 8/1993 | Putty et al. | 73/517 AV |
| 5,264,075 | 11/1993 | Zanini-Fisher et al. | 156/633 |
| 5,295,395 | 3/1994 | Hocker et al. | 73/721 |
| 5,296,408 | 3/1994 | Wilbarg et al. | 437/203 |
| 5,318,652 | 6/1994 | Hocker et al. | 156/273.9 |
| 5,323,051 | 6/1994 | Adams et al. | 257/417 |
| 5,324,683 | 6/1994 | Fitch et al. | 437/65 |
| 5,326,726 | 7/1994 | Tsang et al. | 437/228 |
| 5,335,544 | 8/1994 | Wagner et al. | 73/517 R |
| 5,343,064 | 8/1994 | Spangler et al. | 257/350 |

FOREIGN PATENT DOCUMENTS

| | | | |
|---|---|---|---|
| 4-147679 | 5/1992 | Japan | 257/419 |
| 4-312980 | 11/1992 | Japan | 257/419 |

*Primary Examiner*—Sara W. Crane
*Assistant Examiner*—Roy Potter
*Attorney, Agent, or Firm*—Weingarten, Schurgin, Gagnebin & Hayes LLP

[57] ABSTRACT

A cover for a micromechanical device through which input/output connections to the device are made. The cover includes at least two doped semiconductor standoffs supporting an insulative layer. One or more metalized vias extend from a top surface of the insulative layer, or from a bottom surface of the base, to a respective standoff. Electrical connection is made to the covered device through the metalized vias and doped semiconductor standoffs. The covered chip may be vacuum sealed by providing a ring-like standoff which borders the covered device when the cover is bonded to the base. The resulting covered chip is adaptable for various chip mounting techniques, including flip chip mounting, side mounting combined with either tape automated bonding (TAB) or conductive epoxy connections, or epoxy chip attachment with wire bonding connections. In one embodiment, conductive bumps are formed on the top surface of the insulative cover layer to accommodate flip chip mounting. In another embodiment, conductive traces are run across the top surface of the insulative layer to interconnect the vias to respective edge positioned pads which are electrically interconnected by one of various techniques to pads on a wiring board.

16 Claims, 9 Drawing Sheets

COVERS FOR MICROMECHANICAL SENSORS AND OTHER SEMICONDUCTOR DEVICES

FIELD OF THE INVENTION

This invention relates generally to micromechanical structures and more particularly, to a cover for micromechanical sensors and other semiconductor devices and circuits.

BACKGROUND OF THE INVENTION

Various micromechanical devices, such as micromechanical gyroscopes, require vacuum sealing in order to ensure long-term, accurate operation. Conventional vacuum sealing is achieved by mounting the device in a vacuum sealed housing or enclosure. Input and output electrical connections to and from the enclosed device are provided by embedding conductors through portions of the enclosure to permit conductive traces or wires to be connected to the device.

However, this type of vacuum sealed enclosure tends to be relatively costly. Moreover, tolerances associated with mounting the device in the enclosure may affect the accuracy of a device which is sensitive to spatial orientation. For example, some inertial systems utilize three inertial rate sensors arranged orthogonally with respect to one another. When each such sensor is mounted in a respective vacuum sealed enclosure, tolerances associated with mounting each sensor in the respective enclosure, as well as tolerances associated with mounting the enclosed packages in orthogonal relationship with respect to each other, may adversely affect the accuracy of the system. As is known in the integrated circuit field, various package formats are available for mounting integrated circuits, or chips to wiring boards, printed circuit boards, and other support substrates. For example, flip chips include conductive bumps, or balls for interconnection to complementary pads on a wiring board. The flip chip conductive bumps may be soldered to the circuit board pads or pressed against the circuit board pads so as to provide and maintain reliable electrical interconnection between the conductive bumps of the chip and the complementary conductive pads on the circuit board.

Tape automated bonding (TAB) is another known technique for interconnecting chips to wiring boards. In accordance with this technique, conductive finger-like members cantilevered from conductive pads on the semiconductor chip are bonded to respective pads on the circuit board. Another illustrative technique employed to electrically interconnect chip pads to circuit board pads is wire bonding, in which gold or aluminum wires are bonded to connect the chip pads to the circuit board pads.

SUMMARY OF THE INVENTION

In accordance with the invention, a cover for a semiconductor device is capable of providing vacuum sealing without the drawbacks associated with the use of a separate vacuum sealed enclosure. Moreover, chips utilizing the cover of the invention are adaptable for various types of mounting schemes. The cover includes at least two doped semiconductor standoffs and an insulative layer disposed over the standoffs. The cover is bonded to a base supporting a micromechanical device, with the standoffs adjacent to a top surface of the base. At least one metalized via extends from the top surface of the insulative cover layer to terminate at a respective standoff. Electrical connection to the covered micromechanical device is achieved through the metalized via and the respective conductive standoff.

The top surface of the insulative cover layer is processed to permit various forms of mounting the covered chip to a printed circuit board or other support structure. In accordance with a flip chip mounting embodiment, conductive bumps are provided on the top surface of the insulative cover layer adjacent to the metalized vias. The conductive bumps are either soldered to, or pressed against respective pads on a printed circuit board to maintain reliable electrical interconnection between the conductive bumps and the circuit board pads.

The covered chip may alternatively be side mounted to a circuit board. To this end, conductive traces are formed on the top surface of the insulative cover layer to extend from the metalized vias to conductive pads positioned adjacent to an edge of the chip. The structure is side mounted to a printed circuit board by epoxy bonding a side of the chip to the circuit board and electrically interconnecting the chip pads to complementary pads on the circuit board by TAB bonding, wire bonding, or with conductive epoxy.

In applications where vacuum sealing the covered device is desired, a doped continuous semiconductor standoff, referred to herein as a seal ring, is provided on the cover and, in assembly borders the covered micromechanical device. Use of the seal ring is also advantageous in instances in which the micromechanical device does not require a vacuum environment, but would benefit from being covered to protect the device from adverse environmental effects, such as particulate contamination. In this case, intentional leaks may be provided in the seal ring to balance the inside and outside pressures.

With this arrangement, a cover for a micromechanical sensor or semiconductor device provides flexibility in mounting the resulting covered chip to a circuit board. This flexibility is achieved by bringing the input/output connections to the device out of the covered structure through one or more metalized vias extending through the cover. The top surface of the insulative cover layer is processed in accordance with a selected mounting scheme, such as flip chip or side mounting.

Moreover, because the cover of the present invention is attached to the base supporting the micromechanical device, the effect of tolerances on the position of the device can be reduced, as compared to mounting the device in a separate enclosure. The resulting reduced susceptibility to mounting tolerances can be critical in inertial sensing systems. That is, whereas conventional vacuum sealed enclosures require attention both to tolerances associated with mounting the sensor in the enclosure, as well as to tolerances associated with mounting multiple such enclosures in a precise relationship with respect to each other and relative to the structure in which they reside, the present invention eliminates any effect of tolerances associated with mounting the sensor in a separate enclosure by eliminating the use of such a separate enclosure.

In accordance with a further embodiment of the invention, the input/output connections to the covered device are brought out of the chip through the base. To this end, the cover includes at least two doped semiconductor standoffs supporting an insulative layer thereover, with the standoffs bonded to a top surface of a base supporting a micromechanical device. At least one metalized via extends from a bottom surface of the base to a respective one of the cover standoffs and the bottom surface of the base is processed to permit electrical interconnection to the covered device through the at least one metalized via and the respective doped standoff.

Also described is a process for fabricating a covered chip, including doping a silicon wafer to provide a doped layer in a first surface of the wafer, selectively etching the first wafer surface to form at least two protruding regions and bonding the etched side of the wafer to an insulative layer with the protruding regions adjacent to a bottom surface of the insulative layer. The method also includes forming at least one via through the insulative layer to extend from a top surface to a respective one of the protruding regions, metalizing the via and removing the undoped part of the silicon wafer. The cover thus formed is adapted for bonding to a top surface of a base supporting a micromechanical device with the protruding regions adjacent to the top base surface. In one embodiment, in which the device is vacuum sealed, the selective etching step forms a continuous protruding region which, in assembly, extends around the periphery of the covered device.

With this arrangement, the cost and processing complexity of providing a micromechanical device with a cover, either vacuum sealed or otherwise, is reduced. These advantages are realized by bonding the cover to the micromechanical base at the wafer level, as opposed to the conventional practice of mounting individual devices in separate vacuum sealed enclosures, as well as by providing input/output connections to the device in the same process step in which the device is vacuum sealed. Moreover, the resulting covered chip has a reduced susceptibility to mounting tolerance effects and is well suited for various chip mounting techniques.

DESCRIPTION OF THE DRAWINGS

The above and further advantages of this invention may be better understood by referring to the following description taken in conjunction with the accompanying drawings, in which.

DETAILED DESCRIPTION OF THE INVENTION

Referring to FIGS. 1–5, the fabrication of a cover 26 (FIG. 5) in accordance with the invention will be described.

Figure 1:
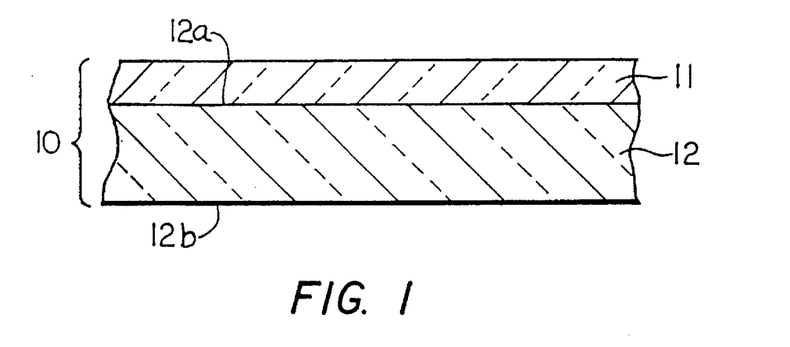
FIGS. 1, 2, 3, 4 and 5 are cross sectional views of a cover during various stages of fabrication.

As shown in FIG. 1, a silicon wafer 12 having an illustrative thickness of between approximately ten and thirty mils is provided. As will become apparent with reference to FIG. 5 below, a portion of the silicon wafer 12 is etched away during a later processing step. For this reason, it is desirable to keep the silicon wafer thickness to a minimum. On the other hand however, a thicker silicon wafer 12 may be easier to handle during processing, particularly where the silicon wafer has a relatively large diameter. In the illustrative embodiment, the wafer 12 is comprised of silicon; however, other materials may alternatively be used.

The silicon wafer 12 is doped to a predetermined depth, such as to approximately sixteen microns, with a dopant, such as boron, to provide doped layer 11, as shown in FIG. 1. The doping concentration is selected to provide the resulting layer 11 with a desired conductivity, since the doped layer 11 forms a portion of the conductive path to input/output connections of a micromechanical device covered by a cover fabricated in the manner presently described.

Figure 2:
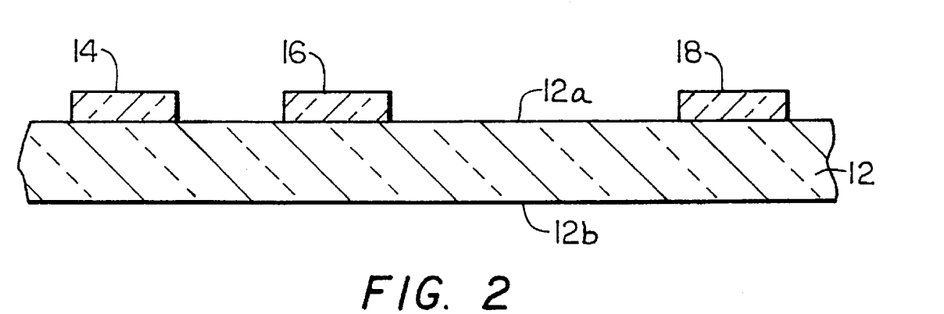

The doped layer 11 is then masked and etched to form doped protruding regions 14, 16 and 18, as shown in FIG. 2, thereby exposing portions of the undoped silicon. While various etching techniques and etchants are suitable for forming regions 14, 16 and 18, in one embodiment, reactive ion etching (RIE) is used. RIE is advantageous due to the precise structural definition that can be obtained with this technique.

Figure 9:
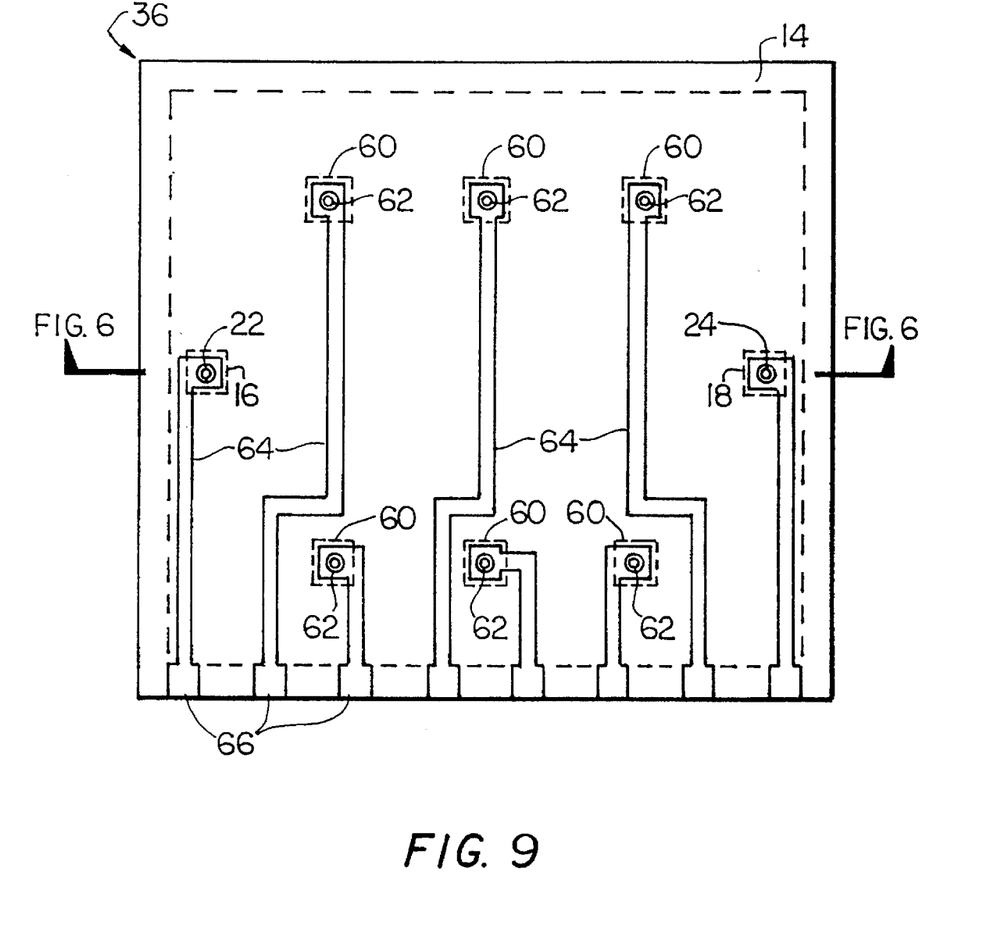
FIG. 9 is a plan view of the chip of FIG. 6.

In one embodiment, one of the regions 14 is formed as a continuous ring-like structure, referred to alternatively as a seal ring (FIG. 9). In assembly of the cover to a substrate supporting one or more micromechanical devices, the seal ring 14 of the cover is disposed around the periphery of the covered micromechanical device. Use of the seal ring 14 permits the resulting covered micromechanical structure, or chip to be vacuum sealed, as will be described. Regions 16, 18 are discrete, non-unitarily formed regions through which input/output connections to a covered micromechanical device are made.

Although, in applications not requiring a vacuum sealed structure, the seal ring 14 may be eliminated, use of the seal ring 14 still may be advantageous for several reasons. As will become apparent, the protruding regions 14, 16, 18 (FIG. 5) of the cover are bonded to a base supporting a micromechanical device. Thus, even in devices not requiring a vacuum environment, it may be advantageous to form seal ring 14 for the additional support provided to the cover around the periphery of the chip. Moreover, the protection provided by the seal ring 14 is particularly beneficial when the cover of the invention is disposed over a micromechanical structure having moving parts in order to protect the covered device from particulate contamination.

Figure 3:
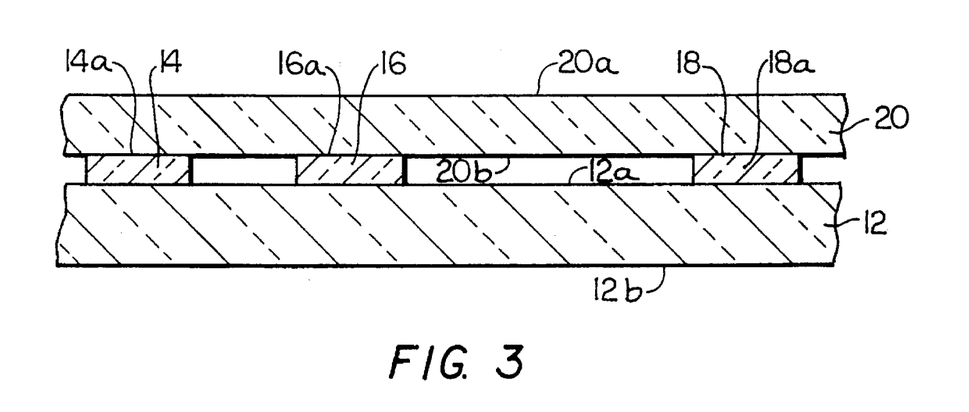

Referring also to FIG. 3, an insulative layer 20 having a top surface 20a and a bottom surface 20b is bonded to the structure of FIG. 2 and specifically, to the top surface 14a, 16a, 18a of regions 14, 16 and 18, respectively, as shown. Various types of bonding techniques are suitable, such as anodic bonding or diffusion bonding. Diffusion bonding requires that the contacting surfaces be coated with an easily diffused material, such as gold. Such coating may be achieved by any suitable process, such as plating or sputtering. Thus, bonding the structure of FIG. 2 and the insulative layer 20 of FIG. 3 requires that the top surfaces 14a, 16a, and 18a of respective regions 14, 16 and 18, as well as confronting surface portions of the bottom insulative layer surface 20b be coated with gold. With the regions 14, 16, 18 and layer 20 thus coated and aligned with respect to one another, the structure is heated and subjected to a force resulting in a pressure sufficient to overcome the yield point of the gold coating. The pressure and heat are maintained for a duration sufficient for forming the diffusion bond.

Figure 6:
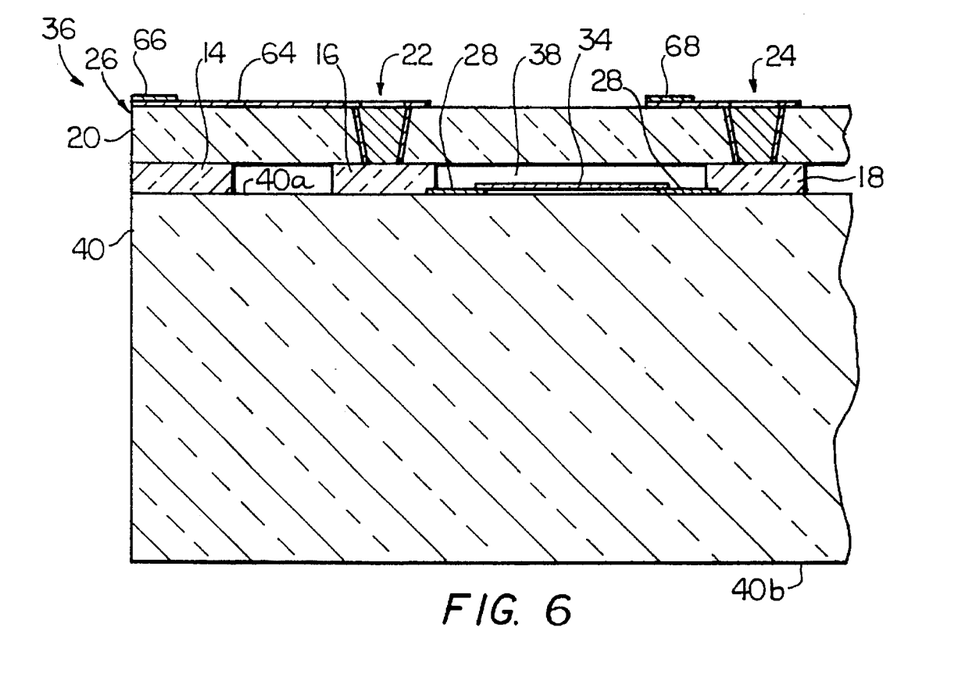
FIG. 6 is a cross sectional view of a micromechanical chip including the cover of FIGS. 1–5.

In one embodiment, the insulative layer 20 is comprised of glass and specifically, of PYREX™. While other insulative materials may be suitable for providing the cover layer 20, glass has several advantages. First, glass layer 20 is transparent, thereby facilitating alignment of the cover with a base 40 to which it is mounted (FIG. 6). Additionally, glass layer 20 permits laser trimming of the micromechanical device, as described in U.S. Pat. No. 5,144,184 entitled "MICROMECHANICAL DEVICE WITH A TRIMMABLE RESONANT FREQUENCY STRUCTURE AND METHOD OR TRIMMING THE SAME" and incorporated herein by reference, to be accomplished through the cover. Additionally, it is advantageous to use a cover material having a similar expansion coefficient as the material comprising the base to which it is bonded. Since PYREX™ glass and silicon are typical base materials, a PYREX™ glass cover layer 20 has a well matched expansion coefficient to the typical base. Finally, PYREX™ glass is a good electrical insulator.

The top surface 20a of the insulative layer 20 can be ground and lapped to reduce the thickness of layer 20. Illustrative thickness of insulative layer 20 are on the order of approximately 1.0 to 3.0 mils and, in one embodiment, the insulative layer 20 is approximately 2.0 mils thick.

Figure 4:
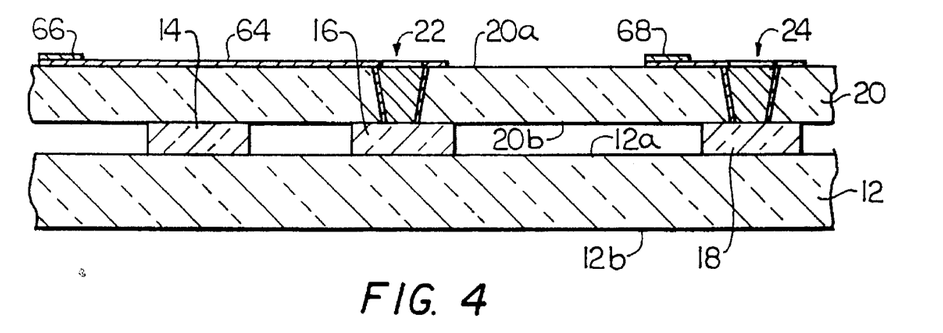

In one embodiment, the insulative layer 20 is processed to form vias 22, 24 therethrough extending from the top surface 20a to a respective one of the doped regions 16, 18, as shown in FIG. 4. Various techniques are suitable to provide the vias 22, 24, such as laser drilling or etching, by wet etching, electrode assisted wet etching, RIE or some combination of these methods. In the case where the vias 22, 24 are etched, doped regions 14, 16 and 18 serve as etch stops. Note that if vias 22, 24 are laser drilled however, it may be desirable to form the vias 22, 24 through layer 20 prior to bonding the insulative layer 20 to the regions 14, 16 and 18.

The vias 22, 24 are metalized by any suitable technique, including sputtering, evaporation, chemical vapor deposition, or even the use of metal resonates, as discussed below. It may be desirable to provide a slight taper to the via walls, as shown in FIG. 4, since such a taper facilitates metalizing the vias with certain techniques.

More particularly, where the vias 22, 24 are relatively shallow (i.e., where the via depth is approximately equal to the via diameter as is the case of vias 22, 24 in insulative layer 20), sputtering or evaporation techniques are well suited for metalizing the vias. One illustrative metalization system includes a bonding layer of titanium, over which layers of platinum and gold are provided. Alternatively, and particularly when metalizing relatively deep vias (like vias 54, 58 through the base 48 shown in FIG. 8 as discussed below), chemical vapor deposition is well suited for metalizing the vias with various materials, such as nickel. As a further alternative metalization technique, the vias may be filled with a metal resonate, including metal atoms combined with organic molecules. Thereafter, the structure is fired during which the organic material is removed, thereby leaving a coating of metal in the vias.

A micromechanical chip including a cover in accordance with 14 the invention is readily adaptable to be mounted to a wiring board or other support structure in accordance with various mounting techniques, as shown in FIGS. 9–15. Some of these mounting techniques require further processing steps to be performed on the top surface 20a of the insulative cover 20. For example, one or more conductive traces, such as illustrative trace 64, may be formed over the top surface 20a of the insulative cover layer 20. Such conductive traces 64 extend from one of the metalized vias 22, 24 to a respective edge positioned pad 66 formed on the top surface 20a of cover layer 20.

Figure 10:
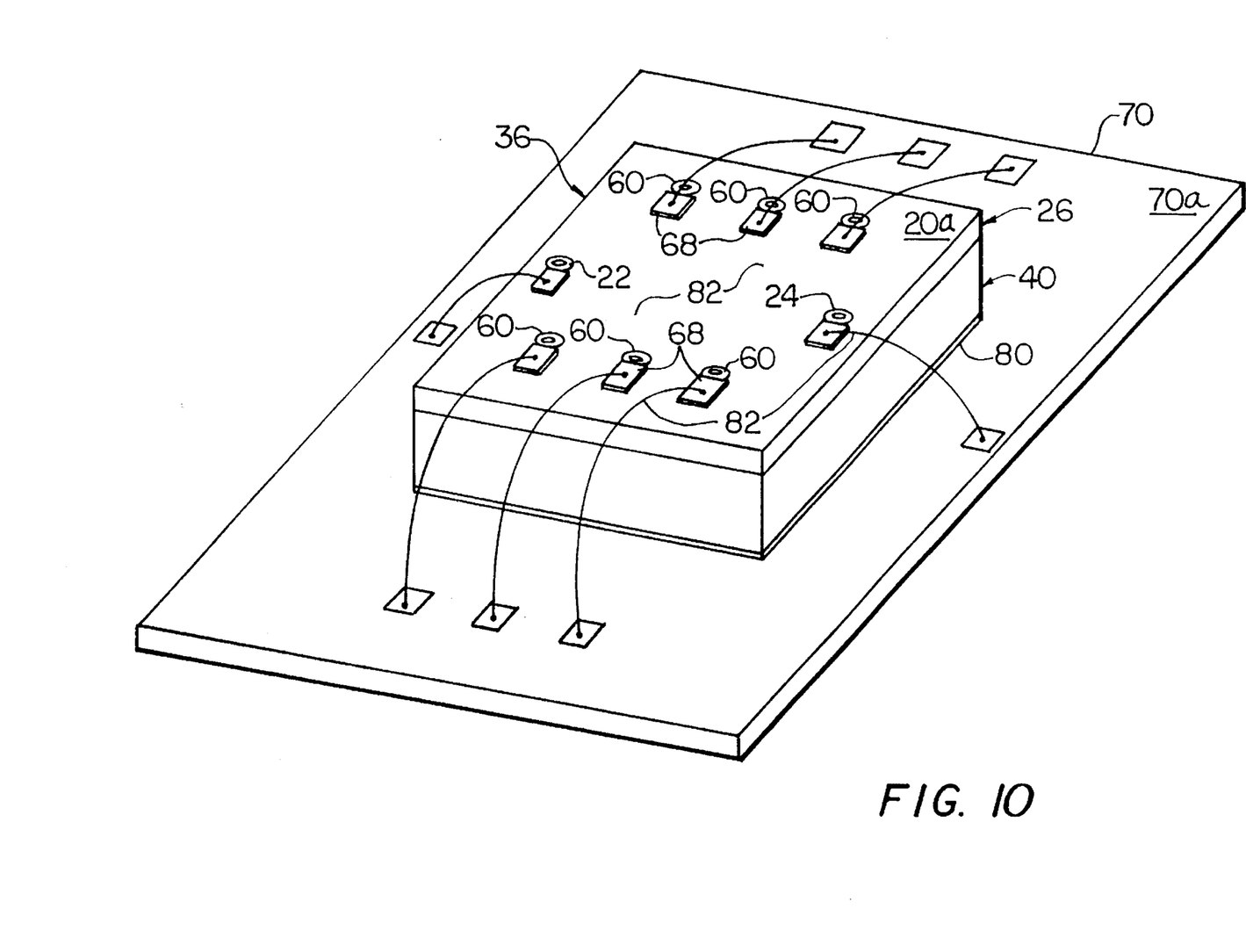
FIG. 10 is an isometric view of a chip mounted to a printed circuit board by wire bonding.

In embodiments in which conductive traces 64 are not run over the top surface 20a of the cover layer 20, pads, such as illustrative pad 68, are formed adjacent to and in electrical connection with the metalized vias, as shown for via 24, to facilitate electrical interconnection between the via 24 and a printed circuit board, as shown in FIG. 10. Although the cover layer 20 of FIG. 4 is shown to have one via 22 in electrical communication with a conductive trace 64 and a second via 24 in electrical communication with an adjacent pad 68, in general cover layer 20 will be processed either to have traces 64 extending from each via to remotely positioned pads, as in the embodiments of FIGS. 9, 11, 13, and 15, or to have pads 68 positioned adjacent to each via, as in the embodiment of FIG. 9. Illustrative pads are four mils square to accommodate wire bonding and TAB chip mounting techniques. Somewhat larger pads may be desirable for accommodating flip chip mounting.

Various techniques may be employed to provide the pads 68 and/or conductive traces 64 over the top surface 20a of cover layer 20. In accordance with one such technique, the top cover surface 20a is metalized during the same process step in which the vias 22, 24 are metalized. Thereafter, the surface metalization is selectively patterned with conventional photolithography techniques to form a desired pattern of traces 64 and pads 68.

Figure 5:
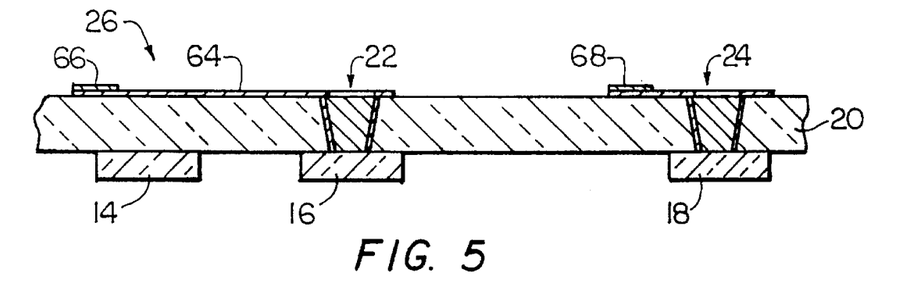

The undoped silicon is removed to provide the cover 26, as shown FIG. 5. Various types of etchants, such as ethylene diamine pyrocatechol (EDP), and etching techniques, such as those mentioned above in conjunction with etching vias 22, 24, may be used to selectively etch away the undoped silicon of the wafer 12. Here again, the doped regions 14, 16 and 18 serve as etch stops.

Referring also to FIG. 6, the cover 26 is bonded to a base 40 having a top surface 40a supporting a micromechanical device 34 and a bottom surface 40b, to form a covered micromechanical structure, or chip 36. As is apparent from the view of FIG. 6, in assembly, the doped regions 14, 16, 18 support the insulative cover layer 20 in spaced relationship with respect to the top surface 40a of the base 40, thereby creating a chamber 38 in which the device 34 is contained. Thus, region 14 may alternatively be referred to as a seal ring and regions 16, 18 may alternatively be referred to as standoffs. More generically, regions 14, 16, 18 may be referred to as supports.

In one embodiment, the base 40 is comprised of PYREX™ and the micromechanical device 34 is an inertial sensor, such as a gyroscope. Alternatively however, the base 40 may be comprised of other materials, such as silicon, and the micromechanical device 34 may be other types of sensors, such as an accelerometer or a pressure sensor, or other micromechanical and semiconductor circuits. An illustrative thickness of the base 40 is on the order of approximately thirty mils.

Conductive traces 28 are provided across a portion of the top surface 40a of the base 40 extending from input and output pads of the micromechanical device 34. The traces 28 extend to areas on the surface 40a which the doped regions 16, 18 of the cover 26 contact in assembly. With this arrangement, electrical interconnection to the input/output pads of the micromechanical device 34 is provided through traces 28, doped regions 16, 18 and metalized vias 22, 24.

The bonding of the cover 26 to the base 40 may be achieved by anodic bonding or alternatively, by diffusion bonding. As described above, diffusion bonding requires the bonded surfaces to be coated with gold or other suitable metal, such as by any conventional plating or deposition process. Thus, in the present process step, portions of the top surface 40a of base 40 and aligned bottom surface portions of the seal ring 14 and standoffs 16, 18 are coated with gold. With the cover 26 and base 40 thus coated and aligned with respect to one another, the structure is heated and subjected to a force resulting in a pressure sufficient to overcome the yield point of the gold coating.

In applications in which the cover 26 is to provide a vacuum seal, the bonding step is carried out in a vacuum, in which the structure is pre-baked at temperatures of up to approximately 400° C. in order to minimize outgassing after sealing.

Figure 7:
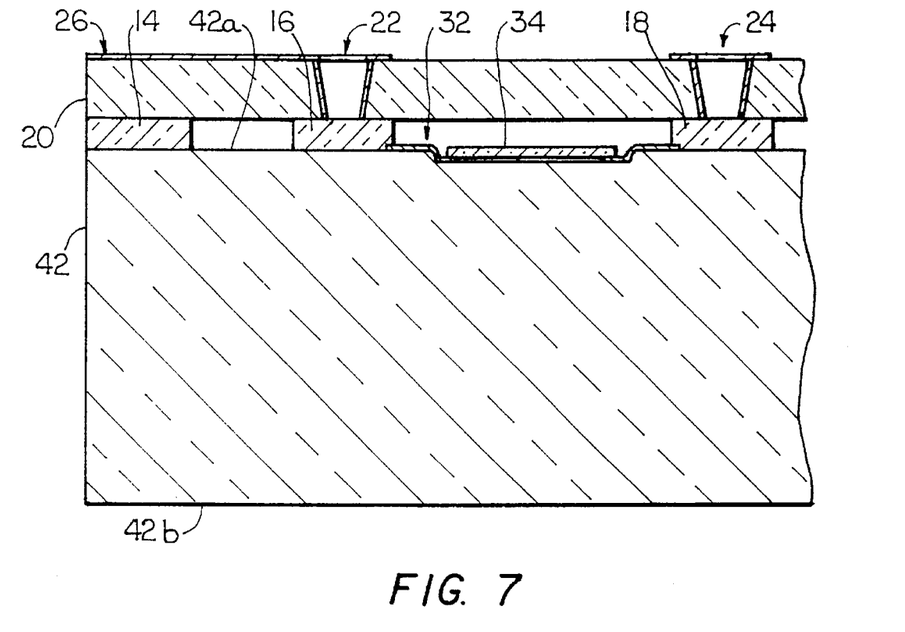
FIG. 7 is a cross sectional view of an alternate chip including the cover of FIGS. 1–5.

Referring to FIG. 7, an alternate base 42 having a top surface 42a and a bottom surface 42b is shown to have cover 26 bonded thereto. The top surface 42a of base 42 has a depression 32 formed therein by etching, with the micromechanical device 34 positioned in the depression 32. With this arrangement, additional clearance between the bottom surface 20b of the insulative cover layer 20 and the top surface of the device 34 is provided. Alternatively, the standoffs 16, 18 may be made shorter in height so that the insulative cover layer 20 is spaced from the top surface 42a of the base 42 by a smaller distance than otherwise necessary to provide ample clearance for the device 34. This shorter standoff height may be desirable since the processing time necessary to dope and etch the standoffs may be reduced.

Figure 8:
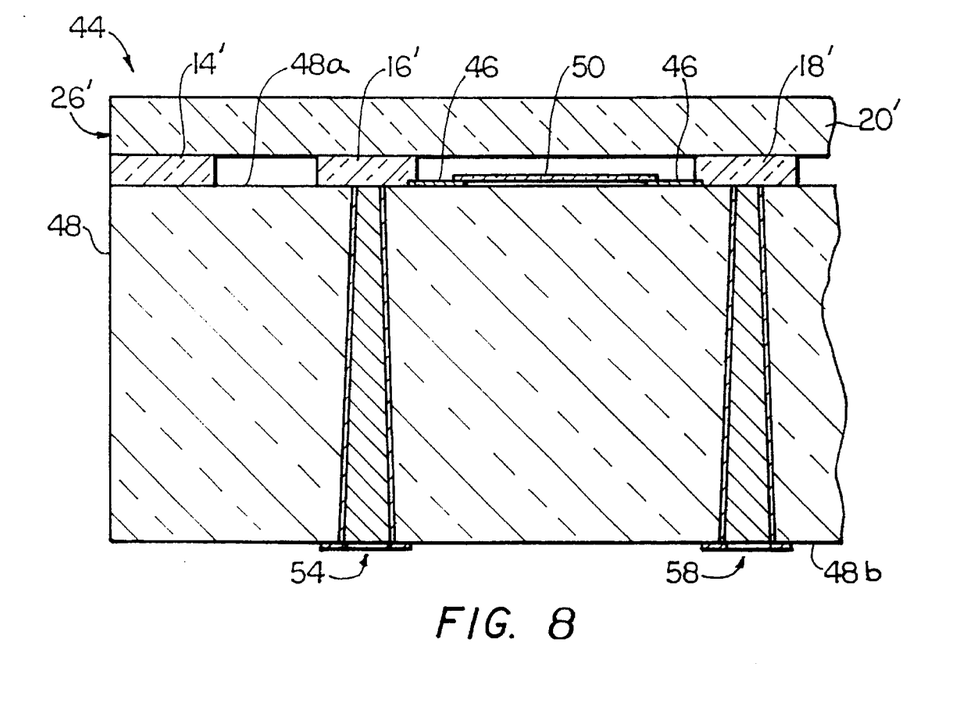
FIG. 8 is a cross sectional view of a further alternate covered chip.

Referring to FIG. 8, an alternate cover embodiment 26' is shown. Cover 26' differs from cover 26 in that cover 26' does not include vias 22, 24. Thus, in the fabrication of cover 26', the steps of etching vias 22, 24 in the insulative layer 20 and metalizing the etched vias (FIG. 5) are eliminated. Otherwise cover 26 is fabricated as described above. Thus, cover 26' includes a seal ring 14', standoffs 16', 18' and an insulative cover layer 20' identical to like components 14, 16, 18 and 20 of cover 26.

Cover 26' is mounted to a top surface 48a of a base 48 supporting a micromechanical device 50 in the manner described above in conjunction with FIG. 6, to provide a covered micromechanical structure, or chip 44. Like base 40, base 48 has conductive traces 46 on the top surface 48a extending from input/output pads of the device 50 to permit electrical interconnection to the device. The base 48 has at least one via, and in the illustrative embodiment has two vias 54, 58, provided therein which extend from a top surface 48a to a bottom surface 48b, as shown. Like base 40, base 48 has a thickness on the order of approximately thirty mils. Due to the relatively large thickness of the base 48, as contrasted to the few mil thickness of the insulative cover layer 20, vias 54, 58 are well suited for laser drilling, as opposed etching.

The vias 54, 58 are then metalized in accordance with a selected one of the techniques described above in conjunction with vias 22, 24 to permit electrical interconnection to the covered micromechanical device 50. Such electrical interconnection is provided through the metalized vias 54, 58, doped regions 16' and 18' and traces 46 to the device 50. Thus, whereas the chip 36 of FIG. 6 permits electrical interconnection to the covered device 34 through vias 22, 24 in the cover 26, chip 44 permits electrical interconnection to the micromechanical device 50 through vias 54, 58 in the base 48. Note however, that in applications in which vacuum sealing is not necessary, the vias 54, 58 may be electrically connected directly to traces 46, as opposed to having doped regions 16', 18' positioned thereover.

Referring to FIG. 9, a plan view of the chip 36 of FIG. 6 is shown from the top surface 20a of the cover layer 20, with the seal ring 14 and standoffs 16, 18 shown by dotted lines. As noted above, in assembly, once the cover 26 is aligned with, and bonded to the base 40, the seal ring 14 extends around the periphery of the chip 36 and thus, also extends around the covered micromechanical device 34 supported by the base 40.

The view of FIG. 9 shows six additional doped standoffs (in addition to standoffs 16, 18 shown in the cross sectional view of FIG. 6), each labelled 60. Respective additional metalized vias, each labelled 62, are formed over the additional doped standoffs 60 in the same manner that vias 22, 24 are formed over standoffs 16, 18, respectively. The number and arrangement of doped standoffs, 16, 18 and 60 will vary based on the particular application and on the number of input/output connections to be made to the covered micromechanical device 34.

Figure 12:
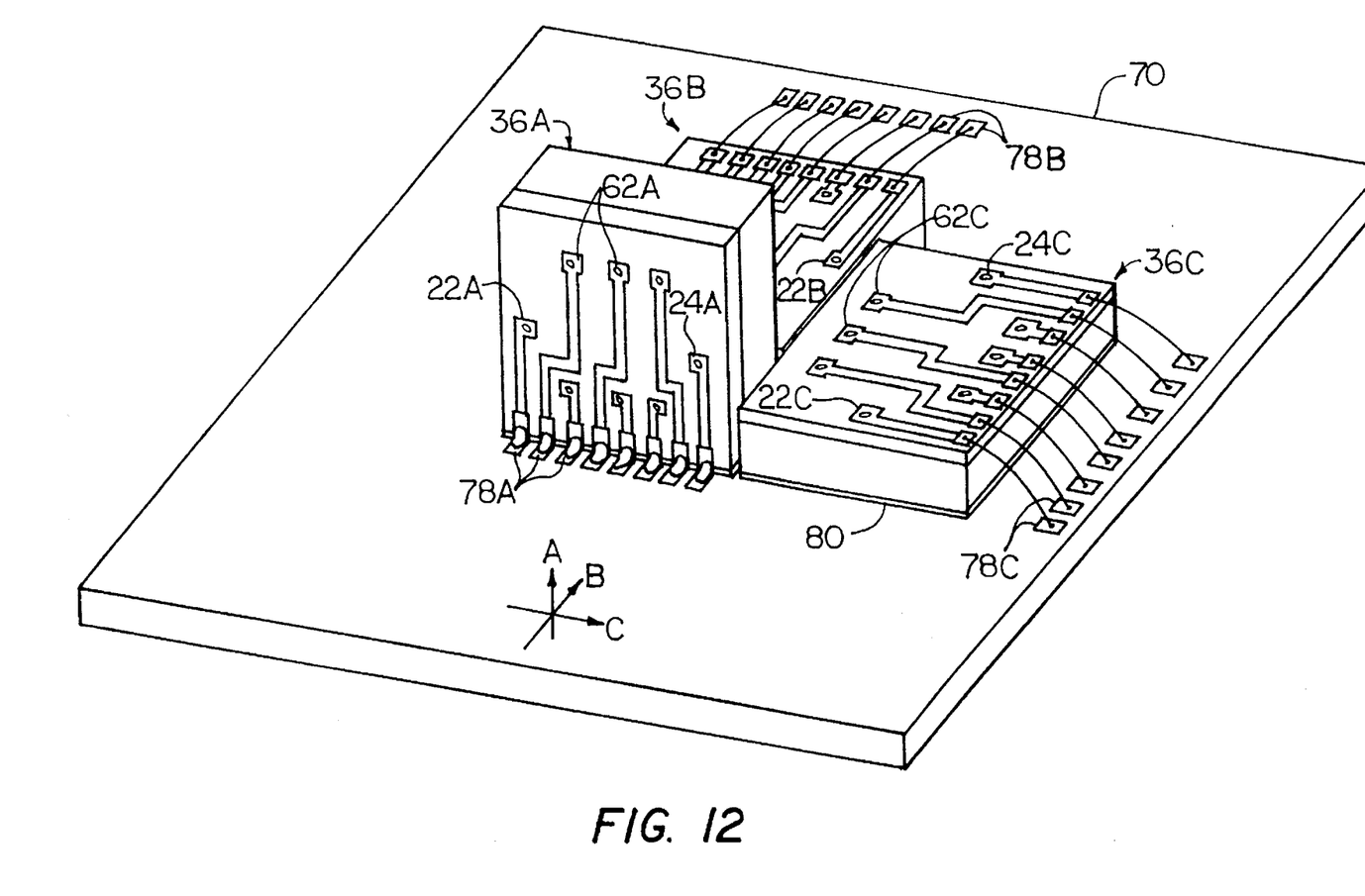
FIG. 12 is an isometric view of three chips mounted to a printed circuit board orthogonally with respect to each other to form a gyroscope.
Figure 13:
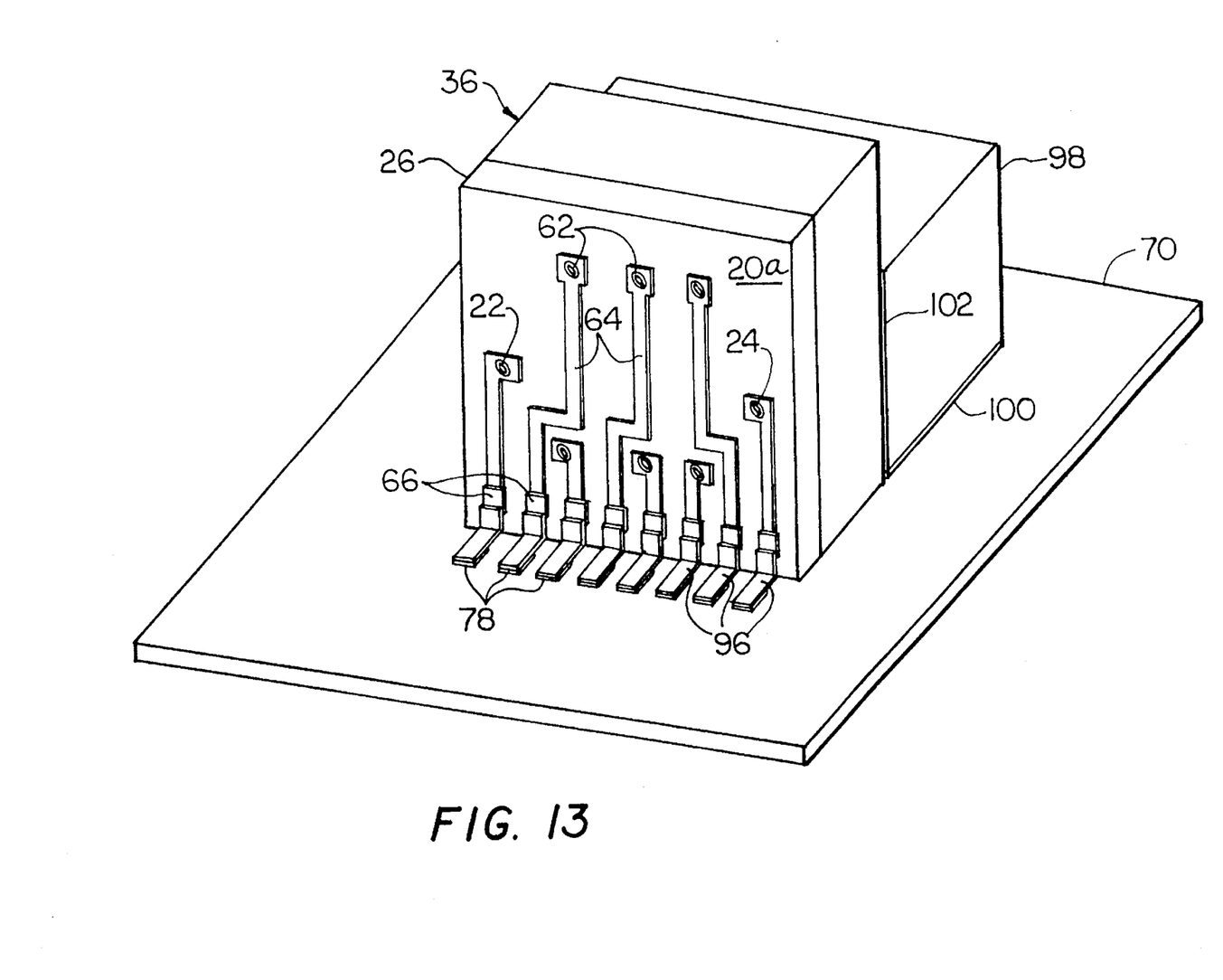
FIG. 13 is an isometric view of a chip edge mounted to a printed circuit board by tape automated bonding.

In the embodiment of FIG. 9, the top surface 20a of insulative cover layer 20 has a plurality of conductive traces 64 thereon which electrically interconnect each of the metalized vias 22, 24, 62 to a respective conductive pad 66 positioned along an edge of the chip 36. Edge positioned pads 66 are conducive to side mounting the chip 36, as shown in FIGS. 11, 12 and 13 and discussed below.

Referring to FIG. 10, chip 36 is shown to be wired bonded to a printed circuit board 70. To this end, fine wires 82 are connected between pads 68 which are adjacent to and in electrical connection with metalized vias 22, 24 and 62 (like illustrative pad 68 shown in FIG. 6) and respective conductive pads 78 on the printed circuit board 70. More particularly, chip 36 is secured to the top surface 70a of the printed circuit board 70, such as by glue 80, in order to ensure accurate placement. Wires 82 are attached at a first end to one of the chip pads 68 and at a second end to a respective one of the pads 78 on the printed circuit board 70, as shown. With this arrangement, a simple technique for mounting and connecting the chip 36 to the printed circuit board 70 is provided.

Figure 11:
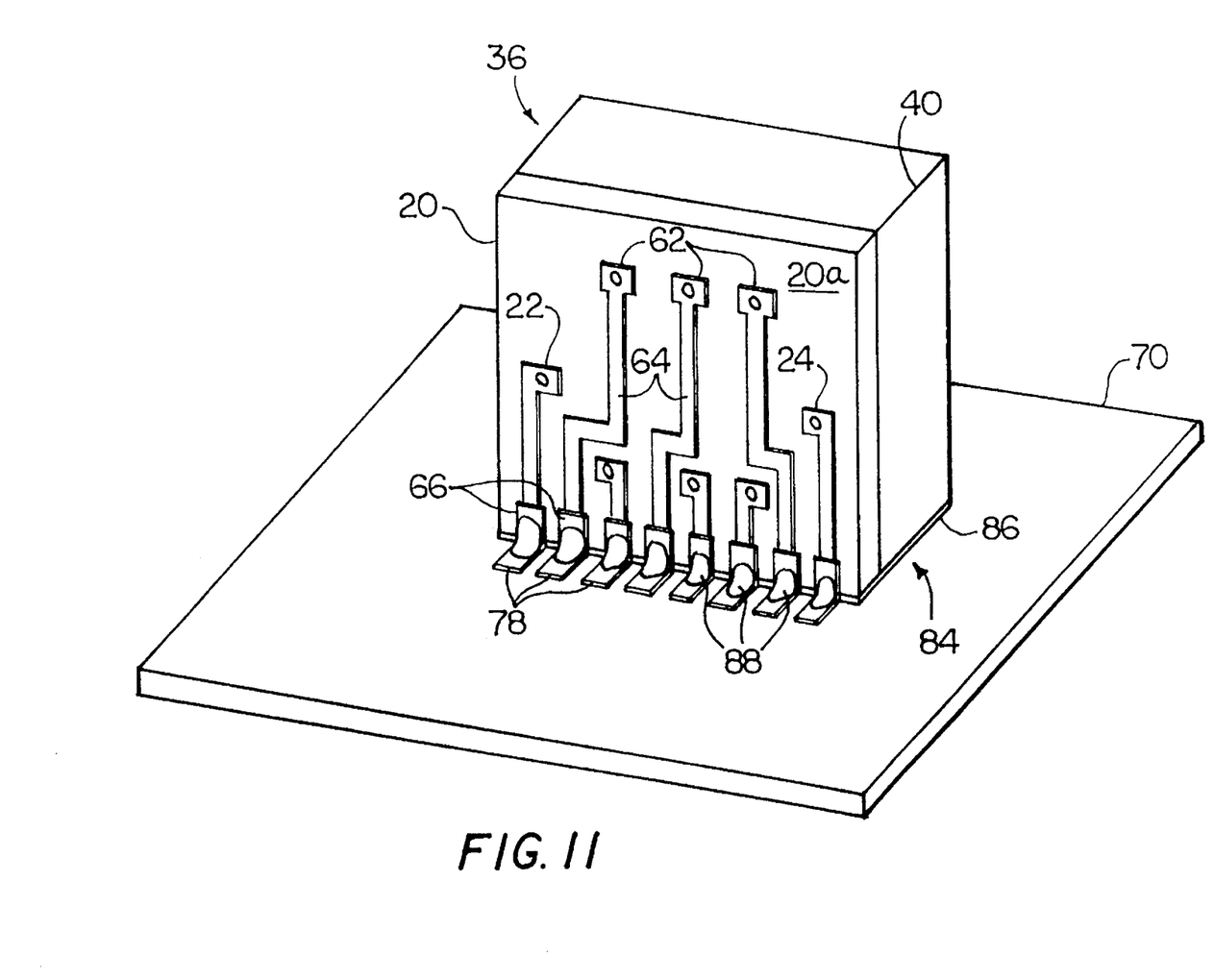
FIG. 11 is an isometric view of a chip edge mounted to a printed circuit board with conductive epoxy.

An alternative chip mounting technique for mounting covered chip 36 to the printed circuit board 70 is shown in FIG. 11, in which the chip 36 is side mounted to the board 70. Side mounting the chip 36 is facilitated by processing the cover 26 to provide conductive traces 64 across the top surface 20a of the cover 20 connecting the metalized vias 22, 24, 62 to edge positioned pads 66, as illustrated in FIG. 9.

Chip 36 is stood on a side 84, with the cover 20 perpendicular to the plane of the printed circuit board 70. In this position, the chip 36 is secured to the printed circuit board 70, such as with non-conductive epoxy 86. In this embodiment, electrical interconnection between the metalized vias 22, 24, 62 and respective circuit board pads 78 is achieved with conductive epoxy 88 which bridges the space between the edge positioned chip pads 66 and the respective printed circuit board pads 78.

The wire bonded chip of FIG. 10 may be combined with the side mounted chip FIG. 11 to provide an inertial sensor system which includes three gyroscope chips mounted on the printed circuit board 70 in orthogonal relationship with respect to one another, as shown in FIG. 12. Side mounted chip $36_A$ provides a first gyroscope sensor, wire bonded chip $36_B$ provides a second gyroscope sensor mounted horizontally on the printed circuit board 70 and thus, with the micromechanical device therein being orthogonal with respect to the device of chip $36_A$. And, wire bonded chip $36_C$ provides a third gyroscope sensor mounted horizontally on the printed circuit board 70 at an orientation ninety degrees rotated with respect to wire bonded chip $36_B$.

Metalized vias $22_A$, $24_A$, $62_A$ of chip $36_A$ are electrically connected to respective adjacent pads $78_A$ on the printed circuit board 70. Conductive pads $78_C$ are provided on the printed circuit board 70 adjacent to the wire bonded chip $36_C$ for electrically interconnecting to the metalized vias $22_C$, $24_C$ and $62_C$ of chip $36_C$. And, conductive pads $78_B$ are provided on the printed circuit board 70 adjacent to chip $36_B$ for electrically interconnecting to the metalized vias $22_B$, $24_B$ and $62_B$ of chip $36_B$. With this arrangement, three micromechanical structures $36_A$, $36_B$, and $36_C$ are oriented orthogonally with respect to one another. More particularly, the micromechanical sensor 34 in chip $36_A$ is positioned with its input axis parallel to an axis A, the micromechanical sensor within chip $36_B$ is positioned with its input axis parallel to an axis B and the micromechanical device in chip $36_C$ is positioned with its input axis parallel an axis C, with each such axis A, B, and C being orthogonal with respect to one another.

Referring to FIG. 13, an alternate side mounting technique is shown for mounting chip 36 to printed circuit board 70. The cover 26 of chip 36 is processed to include conductive traces 64 running across the top surface 20a of the cover 20 to interconnect the metalized vias 22, 24, 62 to pads 66. In the embodiment of FIG. 13 however, the conductive pads 66 are slightly spaced from the edge of the chip 36, as shown. Providing pads 66 slightly recessed from the chip edge facilitates TAB bonding of the chip 36 to the circuit board 70. In accordance with TAB bonding, cantilevered, finger-like members 96 are thermo-compression bonded to the conductive chip pads 66 and either thermo-compression bonded or soldered to respective printed circuit board pads 78, as shown.

In the embodiment of FIG. 13, the chip 36 is supported by a supporting block 98 positioned behind the chip 36 in the view shown. Supporting block 98 is glued to the printed circuit board 70 with glue 100 and the chip 36 is glued to the block 98 by glue 102 so as to secure the sensor 36 in a fixed position relative to the circuit board 70.

It will be appreciated that the chip mounting techniques described herein may be combined in various manners and are selected for a particular application based on the application requirements. As one example, support block 98 be used in conjunction with the side mounting scheme shown in FIG. 11, in place of the side glue 86 shown therein.

Figure 14:
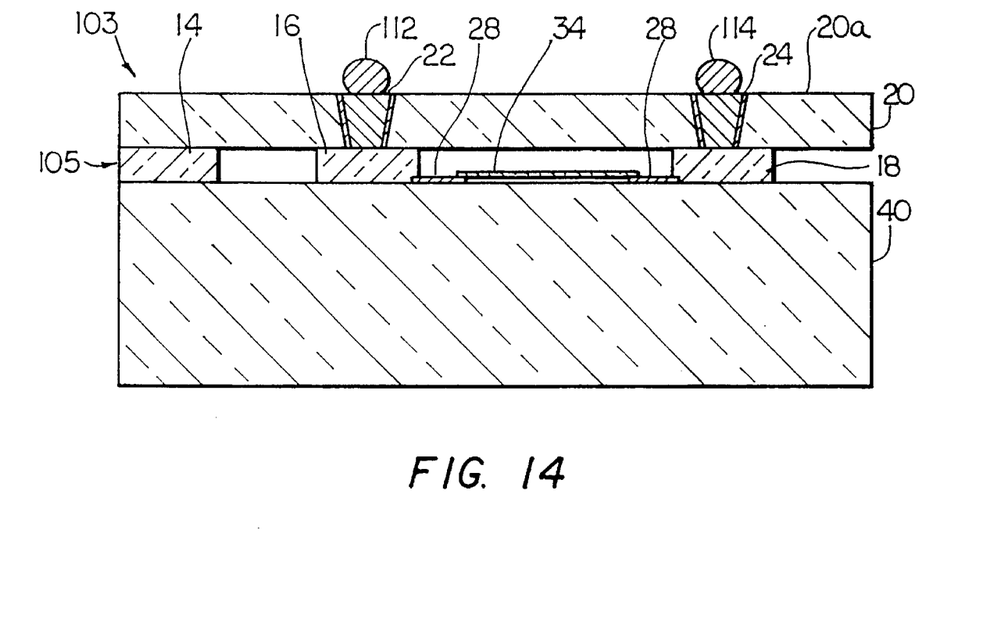
FIG. 14 is a cross sectional view of a covered chip adapted for flip chip mounting in accordance with the invention.

Referring also to FIG. 14, a chip 103 substantially similar to chip 36 (FIG. 6) is adapted for flip chip mounting to a printed circuit board. Chip 103 includes a cover 105 bonded to base 40 (FIG. 6) supporting micromechanical device 34. Cover 105 includes a seal ring 14, doped standoffs 16, 18 and an insulative cover layer 20 and differs from cover 26 of FIG. 5 only in that conductive bumps, or balls 112, 114 are formed over the metalized vias 22, 24.

The conductive bumps 112, 114 may comprise any suitable material for flip chip mounting, such as solder or copper and are adapted for electrical interconnection to respective conductive pads on a printed circuit board. The conductive bumps 112,114 may be soldered to respective circuit board pads or alternatively, may be aligned with and forced against respective circuit board pads, so as to provide and maintain reliable electrical interconnection between the circuit board and the covered device 34 through the conductive bumps 112, 114, metalized vias 22, 24, doped standoffs 16, 18 and conductive traces 28 on the base 40.

Figure 15:
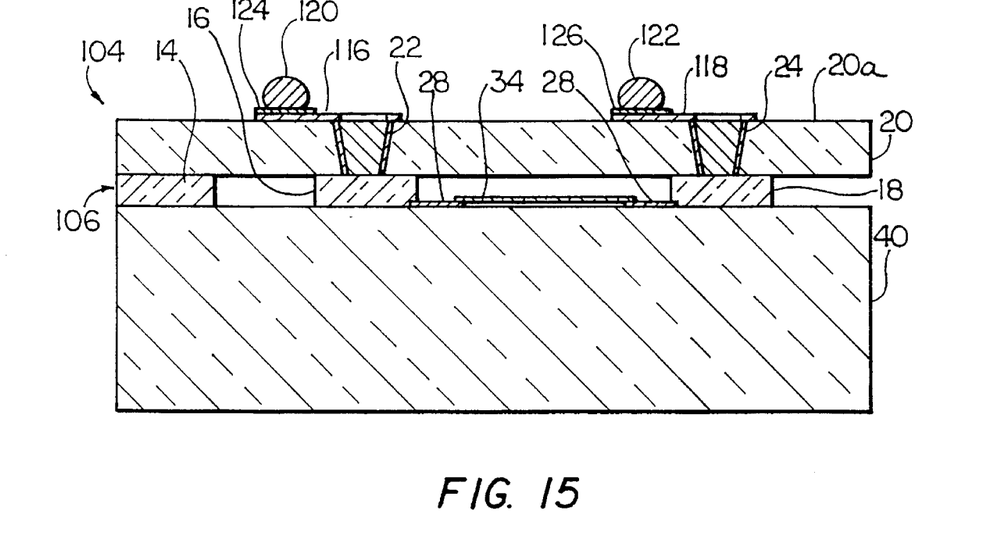
FIG. 15 is a cross sectional view of an alternate covered chip adapted for flip chip mounting in accordance with the invention.

FIG. 15 shows an alternative flip chip mountable chip 104, including a cover 106 bonded to base 40 (FIG. 6) supporting micromechanical device 34. The cover 106 differs from cover 105 (FIG. 14) in the positioning of the conductive bumps relative to the corresponding metalized via 22, 24.

More particularly, in the embodiment of FIG. 15, conductive traces 116,118 are provided over the top surface 20a of insulative cover layer 20 to extend from a respective metalized via 22, 24 to an adjacent pad 124, 126, as shown. Respective conductive bumps 120, 122 are formed on the pads 124, 126, in electrical contact with vias 22, 24 through traces 116, 118, respectively. In this way, electrical contact is provided from the conductive bumps 120, 122 to the micromechanical device 34 through respective pads 124, 126, traces 116, 118, metalized vias 22, 24, doped standoffs 16, 18 and conductive traces 28 on base 40.

With the cover fabrication and mounting schemes described herein, an effective, relatively simple, and versatile cover for micromechanical devices is provided. Use of the seal ring 14 (FIG. 9) permits the chip 36 to be vacuum sealed. Moreover, the vacuum seal thus provided is achieved during the same processing step in which input/output electrical connections to the covered device are provided. That is, the seal ring 14 is bonded to the micromechanical base 40 (FIG. 6) in the same processing step that the standoffs 16, 18 are bonded to the base 40 to permit electrical interconnection to the covered sensor 34 through the cover 26.

Furthermore, the electrical interconnection to the covered device provided by the metalized vias 22, 24 in the cover 26 (or by metalized vias 54, 56 in the base 48 in the embodiment of FIG. 8) is conducive to various types of chip mounting techniques, thereby enhancing the versatility of the resulting chip. For example, conductive bumps can be readily provided in electrical connection to the metalized vias on the top or bottom surface of the chip to permit flip chip mounting of the device, as shown in FIGS. 14 and 15. Alternatively, various forms of side mounting the chip are feasible, such as with the use of conductive epoxy or TAB bonding, as shown in FIGS. 11–13. Furthermore, conventional wire bonding is also suitable for mounting a chip in accordance with the invention to a printed circuit board, as shown in FIG. 10.

A further advantage of the cover structure described herein is the elimination of certain tolerances associated with mounting a micromechanical device in a vacuum sealed enclosure. That is, use of the cover described herein, which is bonded to a micromechanical device base 40 or 48 at the wafer level, as contrasted to mounting the micromechanical device in a separate enclosure, eliminates certain mounting tolerances. Thus, the cover of the present invention is particularly advantageous where mounting orientation must be precisely maintained, such as in the orthogonal mounting of multiple inertial sensors to form an inertial system, as shown in FIG. 12.

A further advantage of the cover arrangement described herein is the relatively small surface area of the micromechanical base 40 or 48 occupied by the cover, since only the region 14 occupies base area that would not be required in an uncovered device. In this way, an increased number and/or size of devices or sensors can be fabricated on a base wafer.

Having described the preferred embodiments, those skilled in the art will realize that many variations are possible which will still be within the scope and spirit of the claimed invention. Therefore, it is the intention to limit the invention only as indicated by the scope of the claims.

I claim:

1. A cover for a micromechanical device comprising:

at least two conductive supports; and an insulative layer having a top surface and a bottom surface disposed over said at least two conductive supports, said insulative layer having at least one metalized via disposed therethrough to extend from said top insulative layer surface to a respective one of said conductive supports.

2. The cover recited in claim 1 wherein said at least two conductive supports are comprised of silicon doped with boron.

3. The cover recited in claim 1 wherein said insulative layer is comprised of PYREX™.

4. The cover recited in claim 1 further comprising at least one conductive bump disposed on said top surface of said insulative layer in electrical contact with said at least one metalized via.

5. The cover recited in claim 1 wherein said top surface of said insulative layer has at least one conductive trace thereon for electrically interconnecting said at least one metalized via to a conductive pad.

6. The cover recited in claim 5 wherein said conductive pad is positioned adjacent to an edge of said insulative layer.

7. A micromechanical structure comprising:

a base supporting a micromechanical device; and a cover bonded to a top surface of said base, said cover comprising:

at least two conductive supports; and an insulative layer having a top surface and a bottom surface disposed over said at least two conductive supports, said insulative layer having a metalized via disposed therethrough to extend from said top surface of said insulative layer to a respective one of said conductive supports.

8. The micromechanical structure recited in claim 7 wherein said device is a micromechanical inertial sensor.

9. The micromechanical structure recited in claim 7 wherein said at least two conductive supports are comprised of silicon doped with boron.

10. The micromechanical structure recited in claim 7 wherein said cover is anodically bonded to said base.

11. The micromechanical structure recited in claim 7 wherein said cover is diffusion bonded to said base.

12. The micromechanical structure recited in claim 7 wherein said insulative layer is comprised of PYREX™.

13. The micromechanical structure recited in claim 7 wherein said base is comprised of PYREX™.

14. The micromechanical structure recited in claim 7 further comprising at least one conductive bump disposed on said top surface of said insulative layer in electrical contact with said at least one metalized via.

15. The micromechanical structure recited in claim 7 wherein said top surface of said insulative layer has at least one conductive trace thereon for electrically interconnecting said at least one via to a conductive pad.

16. The micromechanical structure recited in claim 15 wherein said conductive pad is positioned adjacent to an edge of said micromechanical structure.

* * * * *